United States Patent [19]
Ducourant

[11] Patent Number: 4,649,293
[45] Date of Patent: Mar. 10, 1987

[54] CLOCKED COMPARATOR

[75] Inventor: Thierry Ducourant, Crosne, France

[73] Assignee: U.S. Philips Corporation, New York, N.Y.

[21] Appl. No.: 793,607

[22] Filed: Oct. 31, 1985

[30] Foreign Application Priority Data

Nov. 9, 1984 [FR] France .................. 84 17096

[51] Int. Cl.$^4$ .................. H03K 5/153; H03K 5/24; H03M 1/36
[52] U.S. Cl. .................. 307/362; 307/272 A; 307/279; 307/261
[58] Field of Search .............. 307/350, 355, 362, 530, 307/272 A, 291, 279, 261; 340/347 AD, 347 M

[56] References Cited
U.S. PATENT DOCUMENTS 4,333,020 6/1982 Maeder .................. 307/291
4,539,551 9/1985 Fujita et al. .................. 307/362

Primary Examiner—John Zazworsky
Attorney, Agent, or Firm—Robert T. Mayer; Bernard Franzblau

[57] ABSTRACT

A clocked comparator comprising a comparison stage, for comparing an analog input voltage $V_{IN}$ with an analog reference voltage $V_{REF}$ and for supplying. An intermediate signal $V_M$ and its complement $\overline{V_M}$, an amplifier stage amplifies the logic states of the intermediate signal. A first and a second latching stage are coupled to the comparison stage and the amplifier stage respectively, for generating and storing the logic states determined by the signals from the comparison stage and the amplifier stage. Each latching stage comprises a differential transistor pair having a common terminal connected to ground. A further differential transistor pair is arranged in parallel with the last-mentioned transistor pair and is controlled by a clock signal C for the first latching stage and by its complement $\overline{C}$ for the second latching stage. The comparison stage and the amplifier stage are also controlled by the clock signal C and the latching stages are each coupled to the comparison stage and the amplifier stage respectively by means of load resistors. Useful in a digital/analog converter equipped with enhancement-type gallium-arsenide field-effect transistors.

13 Claims, 4 Drawing Figures

CLOCKED COMPARATOR

The invention relates to a clocked voltage-comparator formed by means of transistors which each have a control electrode and a second main electrode, which comparator comprises:

a comparison stage for comparing an analog input voltage with an analog reference voltage and applying the result of the comparison in the form of an intermediate signal and its complement, which stage comprises two transistors arranged as a first differential pair, the input voltage and the reference voltage being applied to the respective control electrodes of said transistors, whose first main electrodes are connected to a common terminal for applying a bias current and whose second main electrodes are each coupled to a first d.c. supply terminal via a load and supply the intermediate signal and its complement respectively;

a latching stage coupled to the comparison stage, which latching stage serves for generating logic states in conformity with the output signals from the comparison stage, which latching stage comprises two transistors arranged as a second differential pair forming a bistable latch, the signals received from each of the branches of the comparison stage being applied to the respective control electrodes of said latching-stage transistors, whose first main electrodes are connected to a common terminal and whose second main electrodes are cross-coupled to the control electrodes of the transistors of the second pair to form the outputs of said latching stage.

Such a circuit arrangement may be employed, for example, in an analog-to-digital converter of the parallel type in which the analog input signal is applied to the inputs of a plurality of parallel comparator circuits to form a digital output signal, in which comparator circuits this input voltage is compared with a reference voltage which differs for each comparator circuit. The output signals of the comparator circuits are converted into a digital output signal by means of a decoding device. The clocked comparator used in such a parallel analog-to-digital converter is generally of a type as defined in the opening paragraph.

Such a circuit is known, inter alia from U.S. Pat. No. 4,121,120. This known circuit, which is equipped with bipolar transistors, comprises a comparison stage constituted by a first pair of emitter-coupled transistors whose bases receive the input signals. This circuit also comprises an amplifier stage formed by a second pair of emitter-coupled transistors whose bases receive the signals from the collectors of the transistors of the comparison stage. Finally, this circuit comprises two latching stages comprising a third and a fourth emitter-coupled transistor pair, respectively, whose collectors are cross-coupled to the collectors of the first transistor pair and to the collectors of the second transistor pair respectively. Moreover, the emitters of these first, second, third and fourth transistor pair are each coupled to a current source via a transistor switch, the switches of the comparison stage and of the first latching stage having their commoned emitters coupled to a first current source and the switches of the amplifier stage and the second latching stage having their commoned emitters coupled to a second current source. These switches are controlled by clock signals in such a way that the comparison stage and the second latching stage are operated simultaneously, i.e. exactly when the amplifier stage and the first latching stage are inoperative. On the output of the first latching stage this known circuit produces an intermediate signal whose logic states follow the sign of the difference between the input signal and the reference signal applied to the input of the comparison stage, which difference is sampled on a rising edge of the clock signal and which is latched by the second latching stage until another stage appears on a rising edge.

However, in order to realise novel logic systems with a higher information-processing capacity such circuits should be constructed by means of new technologies, such as, for example, a technology using gallium-arsenide field-effect transistors.

If, for example, a depletion-type gallium-arsenide field-effect transistor is selected as the active element of a clocked comparator very high operating speeds can be obtained in combination with a very low power consumption.

However, the requirements to be met in order to obtain a very high operating speed are more stringent than the requirements to be met in order to obtain circuits having a low power consumption.

Therefore, it is the object of the present invention to provide a novel clocked comparator whose operating speed is increased not only by the use of an ultra-fast technology but in particular by the use of a special circuit arrangement without a consequent increase in power consumption.

According to the present invention this object is achieved in a comparator as defined in the opening paragraph, which is characterized in that:

the terminal to which the first differential pair is connected is coupled to a second d.c. supply terminal, for example earth, via a current-source trsnsistor;

the terminal to which the second differential pair is connected is brought directly at the potential on the second d.c. supply terminal, the second differential pair is coupled to a third differential pair comprising two transistors arranged in parallel with the transistors of the second differential pair, a clock signal being applied to the control electrodes of the transistor of said third differential pair.

In this arrangement the latching stage is not disabled by disconnecting a current generator, as in the prior-art method, but by directly imposing the logic stage 0 upon each of the two branches of the differential pair by means of two parallel transistors which are controlled by the same clock signal as the current source of the comparison stage to which said latching stage is coupled. In this way faster operation is achieved.

An embodiment of the invention is characterized in that the second main electrodes of the first differential pair are each coupled to the respective control electrodes of the second differential pair via a coupling resistor. The coupling resistor via which the signals from the comparison stage are applied to the latching stage minimize the adverse effects of switching between the stages.

Embodiments of the invention will now be described in more detail, by way of example, with reference to the accompanying drawings.

Figure 1:
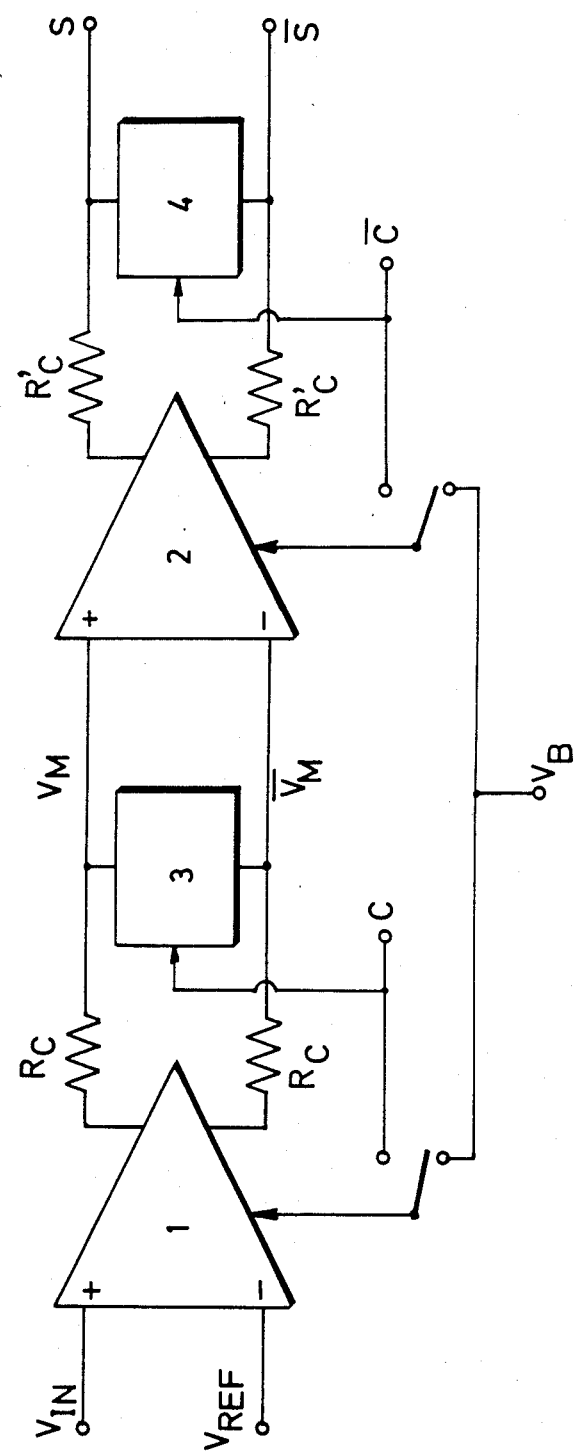
FIG. 1 is a block diagram of the comparator in accordance with the invention.

As is shown in FIG. 1 the clocked comparator in accordance with the invention comprises a comparison stage 1, which is coupled to a first latching stage 3 via coupling resistors $R_C$, and an amplifier stage 2 of a structure similar to that of the comparison stage 1 and coupled to a second latching stage 4 via coupling resistors $R'_C$.

The comparison stage receives an analog signal $V_{IN}$ and an analog reference signal $V_{REF}$. The outputs of the comparison stage, which are coupled to those of the latching stage, supply an intermediate signal $V_M$ and its complement $\overline{V_M}$.

The comparison stage 1 and the latching stage are controlled by the same clock signal C.

The intermediate signal $V_M$ and its complement are applied to the amplifier stage 2. The outputs of this stage, which are coupled to those of the latching stage 4, supply the digital output signal in phase with the value of the difference between the input signal $V_{IN}$ and the reference signal $V_{REF}$.

The amplifier stage 2 and the latching stage 4 are controlled by the complement $\overline{C}$ of the clock signal.

In an embodiment of the invention the comparison stage and the amplifier stage are controlled by means of a fixed potential $V_B$.

Figure 2:
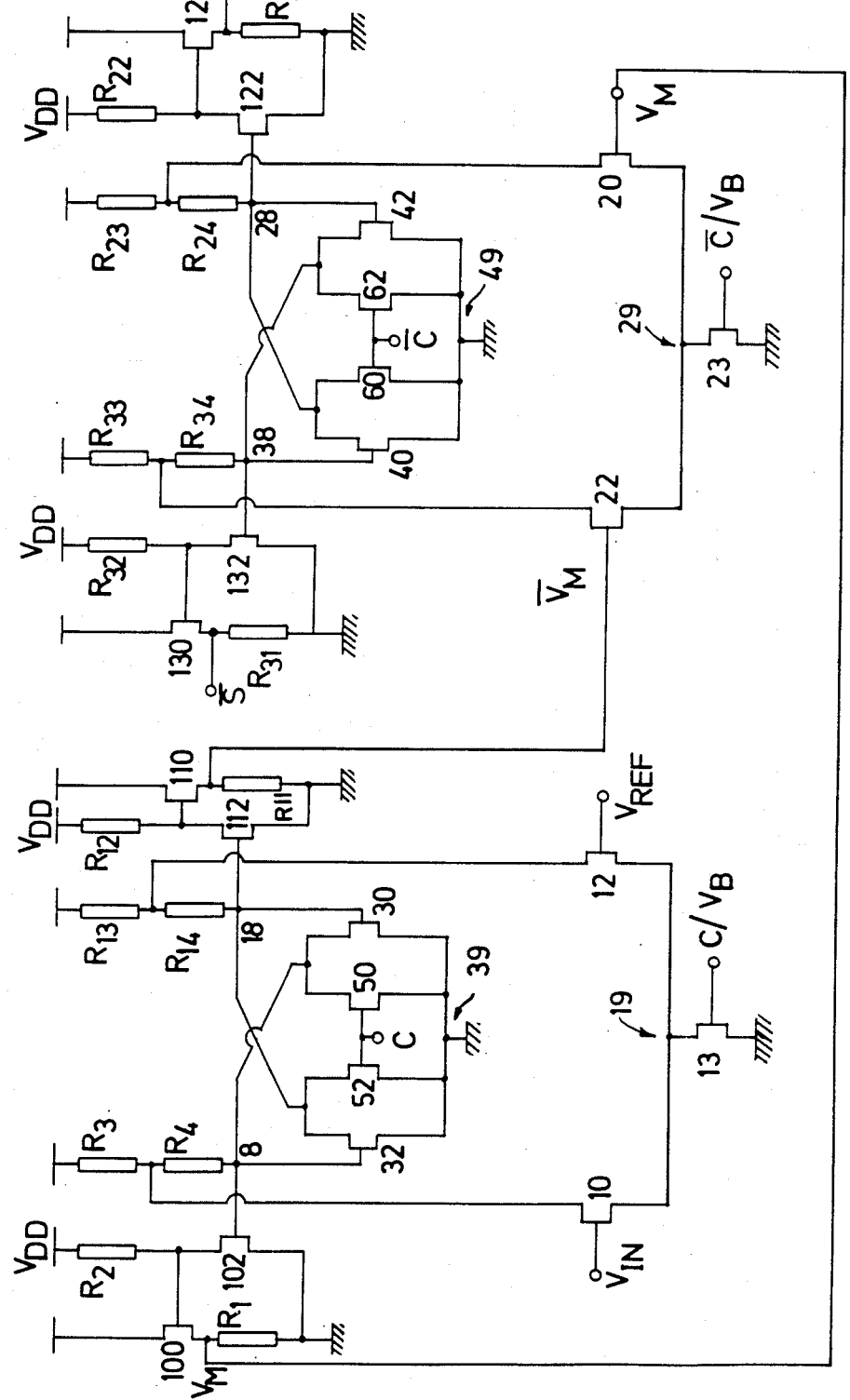
FIG. 2 shows a circuit in accordance with the invention equipped with enhancement-type field-effect transistors.

In an embodiment of the invention shown in FIG. 2 the clocked comparator in accordance with the invention is equipped with enhancement-type field-effect transistors, for example gallium-arsenide transistors with a cut-off voltage $V_T > 0$ such that they are normally cut off in the absence of a signal.

As is shown in FIG. 2, the comparison stage comprises two transistors 10 and 12 whose sources are coupled to each other and whose gates receive the analog input voltage $V_{IN}$ and the analog reference voltage $V_{REF}$ respectively.

The drains of the transistors 10 and 12 receive a first d.c. supply voltage $V_{DD}$ via a load resistor $R_3$ and $R_{13}$ respectively.

The sources of the transistors 10 and 12 which are coupled to the terminal 19 are connected to a second d.c. supply voltage, for example earth potential, via a current transistor 13 controlled by the clock signal C.

The first latching stage comprises two transistors 32 and 30 whose sources are coupled to the terminal 39. This terminal is connected directly to earth potential.

This latching stage is driven by two transistors 52 and 50, which are arranged in parallel with the transistors 32 and 30 respectively, under control of the clock signal C.

When the comparison stage is enabled the latching stage is directly set to the 0 state. It is known that, in order to obtain a satisfactory effect with such a comparison stage coupled to a latching stage, it is essential that the differential pair of the latching stage is disabled at the exact instant at which the differential pair of the comparison stage is enabled. Otherwise the circuit arrangement will exhibit instabilities. It is often very difficult to meet this requirement, in particular when the comparison stage and the latching stage are controlled by different clock signals.

In accordance with the present invention this problem is solved in that the latching stage and the comparison stage are controlled by the same signal.

An additional advantage of this is that the 0 state is obtained immediately. Thus, the transit time within one transistor is gained and the comparator operates more rapidly.

In accordance with an embodiment of the invention a third d.c. supply voltage $V_B$ may be applied to the gate of the currentsource transistor 13 to render this transistor continuously conductive. The comparator stage is then continuously operative and instabilities are also avoided.

This embodiment is very interesting if the comparator comprises only one comparison stage coupled to the first latching stage.

The gates 8 and 18 of the transistors 32 and 30 are cross-coupled to the drains of the transistors 30, 50 and 32, 52 respectively. Moreover, the gates of the transistors 32 and 30 receive the signals from the comparison stage via coupling resistors $R_4$ and $R_{14}$ respectively.

The points 8 and 18 constitute the outputs of the arrangement comprising the comparison stage and the first latching stage.

The points 8 and 18 are connected to inverter/follower stages respectively. Point 8 is connected to an inverter stage comprising the transistor 102 and the load resistor $R_2$ and the follower stage comprises the transistor 100 and the resistor $R_1$.

The inverter stage connected to point 18 comprises the transistor 112 and the resistor $R_{12}$ and the follower stage comprises the transistor 110 and the resistor $R_{11}$.

The inverter stage serves to pull up the high level of the output of the latching stage. The follower stage serves to reduce the output impedance of the combination comprising the comparison stage and the latching stage.

The combination of the amplifier stage and the second latching stage is constructed and operates in exactly the same way as the combination comprising the comparison stage and the first latching stage. However, the transistors and the coupling or load resistors may have slightly different values in order to ensure a better matching.

The amplifier stage comprises two transistors 20 and 22 whose sources are coupled to each other and whose gates receive the intermediate signal $V_M$ and it complement $\overline{V_M}$ respectively appearing on the source electrodes of the transistors 100 and 110 of the follower stages described in the foregoing. The source electrodes coupled to terminal 29 are connected to, for example, earth via a current source transistor 23 which is controlled by the complementary clock signal $\overline{C}$.

The drains of the transistor 20 and 22 are connected to the first d.c. supply voltage $V_{DD}$ via load resistors $R_{23}$ and $R_{33}$ respectively.

The second latching stage comprises two transistors 40 and 42 whose source electrodes are connected to terminal 49. This terminal is connected directly to ground potential.

This latching stage is driven by two transistors 60 and 62, which are arranged in parallel with the transistors 40 and 42 respectively and which are controlled by the complementary clock signal $\overline{C}$.

When the amplifier stage is now enabled the latching stage is immediately set to the 0 state.

In the same way as in the foregoing the third d.c. supply voltage $V_B$ may be applied to the gate of the current-source transistor 23 in order to render this transistor continuously conductive. The amplifier stage is then operated continuously.

The gates 38 and 28 of the transistors 40 and 42 are crosscoupled to the drains of the transistors 42, 62 and 40, 60 respectively. Further, the gates of the transistors 40 and 42 receive the signals from the amplifier stage via coupling resistors $R_{34}$ and $R_{24}$ respectively.

The points 38 and 28 constitute the outputs of this combination of the amplifier stage and the second latching stage.

These points 38 and 28 are connected to inverter/follower stages. The inverter stage connected to point 38 comprises a transistor 132 and the load resistor $R_{32}$ and the follower stage comprises the transistor 130 and the resistor $R_{31}$.

Similarly, the inverter stage connected to point 28 comprises the transistor 122 and the resistor $R_{23}$ and the follower stage comprises the transistor 120 and the resistor $R_{21}$.

The digital output signal of the comparator appears on the source electrode of the follower transistor 120 and its complement S appears on the source electrode of the follower transistor 130.

Figure 3:
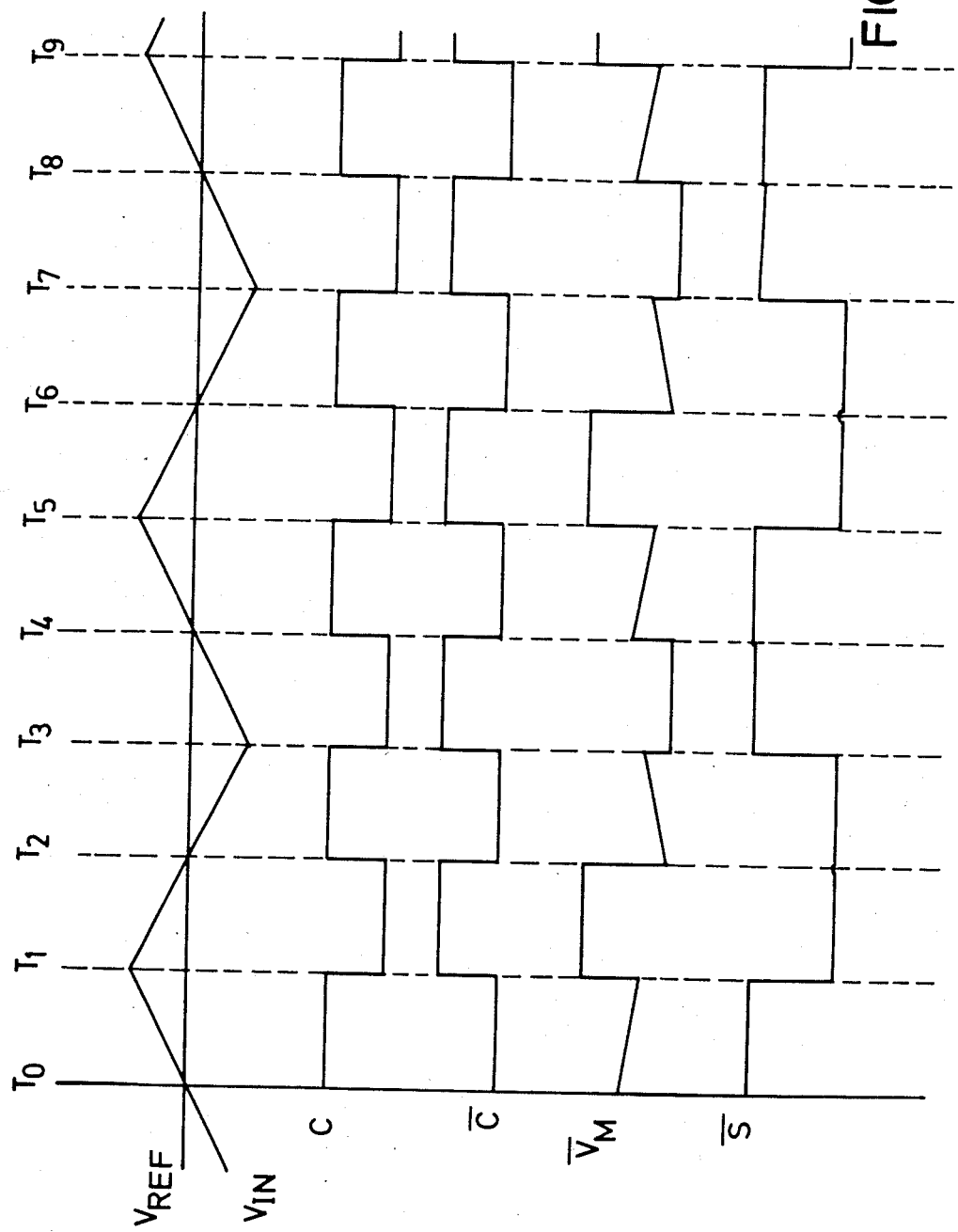
FIG. 3 shows signal waveforms in different parts of the circuit as a function of the clock signals.

As is shown in FIG. 3, when the difference between the analog input signal $V_{IN}$ and the analog reference signal $V_{REF}$ applied to the comparison stage is positive and the rising edge of the clock signal C appears at the instant $T_1$, for example the complementary signal $\overline{V_M}$ is latched in the high stage and the complementary output signal $\overline{S}$ goes low.

Subsequently, if at the instant $T_2$ a rising edge of the clock signal C appears and the difference becomes negative, the complementary signal $\overline{V_M}$ is sampled in the low state and the complementary output signal $\overline{S}$ is latched in the low state.

On the falling edge of the clock signal, at the instant $T_3$, the difference still being negative, the complementary intermediate signal $\overline{V_M}$ is latched in the low state and the complementary output signal $\overline{S}$ is sampled in the high state.

Finally, at the instant $T_4$, when the difference becomes positive on a rising edge of the clock signal C, the complementary output signal is latched in the high state.

Thus, the output signal S remains in phase with the sign of the differnce between the input signal $V_{IN}$ and the reference signal $V_{REF}$.

Figure 4:
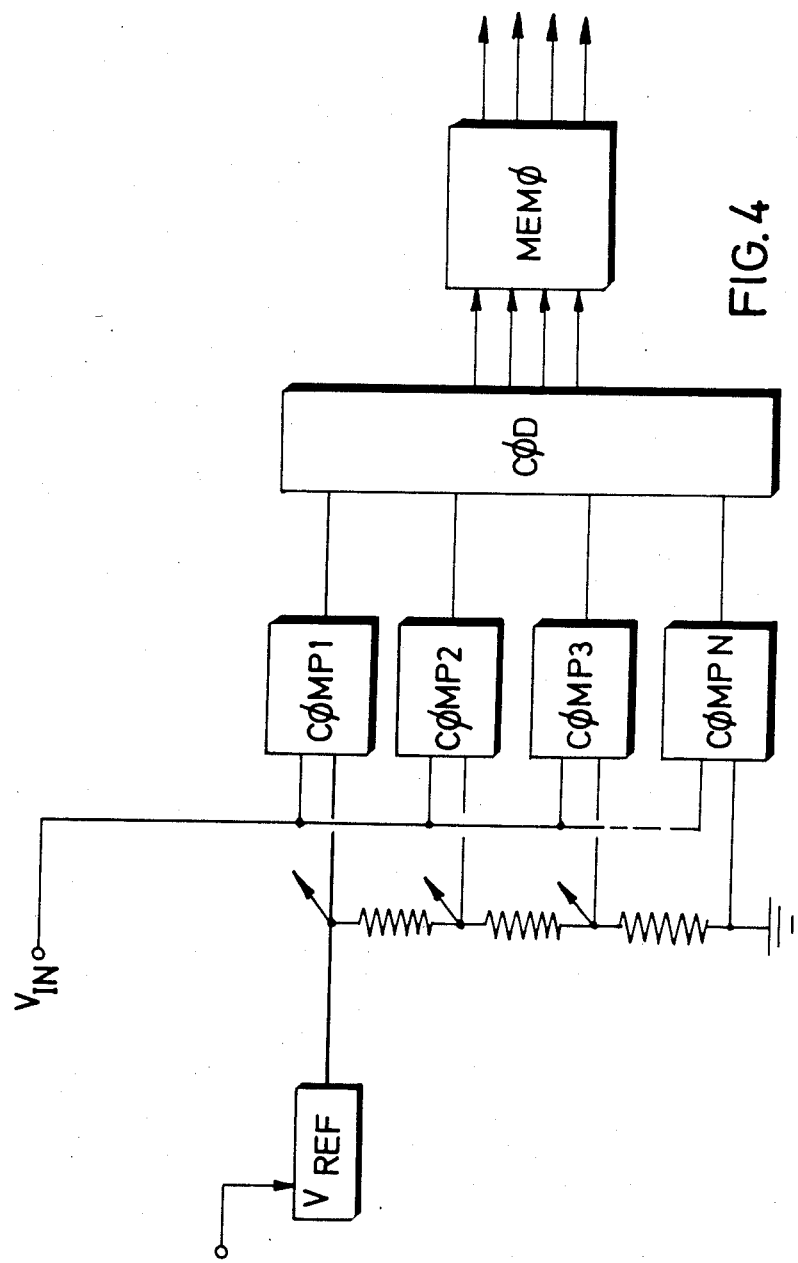
FIG. 4 shows a digital-to-analog converter circuit constructed by means of comparators in accordance with the invention.

The analog-to-digital converter shown in FIG. 4 comprises a plurality of comparators (COMP 1, . . . COMP N) arranged in parallel which comparators each comprise two inputs. The analog input voltage $V_{IN}$ to be converted is applied to an input of each comparator. A reference voltage across the series arrangement of a plurality of resistors is applied to the other input of each comparator. If all the resistors are identical this yields a geometrical progression of reference voltages, the ratio between the reference voltage being $V_{REF/2}$. The various reference voltages with the sequence numbers 1, 2, . . . i, 2n−1, 2n then constitute a series $V_{REF/2n}$, $V_{REF/2}n−1$, . . . $V_{REFn}$, the latter voltages being employed only to indicate an overload bit. The outputs of the comparators are connected to the inputs of a logic encoding device (COD), which supplies an n-bit digital output signal in accordance with an arbitrary code, which may be for example the Gray code. The encoding device is constructed in conformity with the required code, but is not described in detail because this encoding device falls beyond the scope of the present invention. A memory (MEMO) may be coupled to the output encoding device to preserve the information from the encoding device for at least a part of the clock period, thus allowing the comparators to be synchronised. The clock signal for the comparators and the latches is delivered by an external circuit. These circuits may be integrated on the same semiconductor substrate.

If the comparator described here is constructed by means of gallium-arsenide Schottky-gate transistors the voltages $V_{IN}$, $V_{REF}$, $V_M$, $\overline{V_M}$, S and $\overline{S}$ will have high levels of 0.6 V and low levels of 0.1 V.

The threshold voltages of the transistors are $V_T = 0.1$ V.

The d.c. supply voltages are as follows:
the first voltage $V_{DD} = 2$ V
the second voltage = earth potential
the third voltage $V_B = 0.5$ V.

The gate widths L and the values of the resistors R are specified in the following Table.

TABLE I

| Transistors | | Resistors | |
|---|---|---|---|
| No. | L in μm | No. | R |
| 10,12 | 50μ | $R_4$, $R_{14}$ | 1.8 kΩ |
| 32,30 | 20μ | $R_3$, $R_{13}$ | 2.2 kΩ |
| 52,50 | 20μ | $R_2$, $R_{12}$ | 7 kΩ |
| 102,112 | 10μ | $R_1$, $R_{11}$ | 3 kΩ |
| 100,110 | 30μ | | |
| 13 | 30μ | | |
| 22,20 | 25μ | $R_{34}$, $R_{24}$ | 1.6 kΩ |
| 40,42 | 20μ | $R_{33}$, $R_{23}$ | 1.6 kΩ |
| 60,62 | 20μ | $R_{32}$, $R_{22}$ | 7 kΩ |
| 122,132 | 10μ | $R_{31}$, $R_{21}$ | 3 kΩ |
| 130,120 | 30μ | | |
| 23 | 30μ | | |

The use of an identical comparator in an analog-to-digital converter is also advantageous when the converter is constructed as an integrated circuit.

It will be obvious that several variants are conceivable to those skilled in the art without departing from the scope of the present invention as defined in the appended claims.

What is claimed is:

1. A clocked voltage comparator formed by means of transistors which each have a control electrode, a first main electrode and a second main electrode, said comparator comprising:
   a comparison stage for comparing an analog input voltage ($V_{IN}$) with an analog reference voltage ($V_{REF}$) and deriving an intermediate signal ($V_M$) and its complement ($\overline{V_M}$), which stage comprises two transistors coupled as a differential pair, the input voltage and the reference voltage being applied to respective control electrodes of said transistors, whose first main electrodes are connected to a common terminal for applying a bias current and whose second main electrodes are each coupled to a first d.c. supply terminal via a load and supply the intermediate signal and its complement respectively;
   a latching stage coupled to the comparison stage for generating logic states in conformity with the output signals from the comparison stage, said latching stage comprising two transistors coupled together as a second differential pair forming a bistable latch, the signals received from branches of the comparison stage being applied to respective control electrodes of said latching-stage transistors, whose first main electrodes are connected to a common terminal and whose second main electrodes are cross-coupled to the control electrodes of the transistors of the second differential pair to form outputs of said latching stage, characterized in that:

the terminal to which the first differential pair is connected is coupled to a second d.c. supply terminal via a current-source transistor, the terminal to which the second differential pair is connected is directly connected to the potential on the second d.c. supply terminal, the second differential pair is coupled to a third differential pair comprising two transistors coupled in parallel with the transistors of the second differential pair, and means for applying a clock signal to the control electrodes of the transistors of said third differential pair.

2. A comparator as claimed in claim 1, wherein the second main electrodes of the transistors of the first differential pair are each coupled to respective control electrodes of the transistors of the second differential pair via respective coupling resistors.

3. A comparator as claimed in claim 1 wherein the current-source transistor of the first differential pair is controlled by the clock signal.

4. A comparator as claimed in claim 1 wherein the current-source transistor of the first differential pair conducts continuously because it is controlled by the potential of a third d.c. supply voltage.

5. A comparator as claimed in claim 1, wherein the load is resistive.

6. A comparator as claimed in claim 1, wherein an inverter/follower stage is connected to each of the outputs of the first latching stage.

7. A comparator as claimed in claim 6, wherein each inverter/follower stage comprises a first transistor operating as an inverter, whose control electrode receives one of the output signals from the latching stage, whose first main electrode is connected to the second d.c. supply terminal, and whose second main electrode is connected to the first d.c. supply terminal via a resistive load, the output signal of the inverter appearing on the second main electrode of said first transistor, and a second transistor operating as a follower, whose control electrode receives the signal from the inverter, whose first main electrode is connected to the second d.c. supply terminal via a resistor, and whose second main electrode is connected to the first d.c. supply terminal, the output signal of each inverter/follower stage appearing on the first main electrode of the follower transistor.

8. A comparator as claimed in claim 7, wherein digital signals from the combination of the comparison stage and latching stage are available at the outputs of the inverter/follower stages connected to the output of the first latching stage.

9. A comparator as claimed in claim 1 wherein the transistors are enhancement-type gallium-arsenide field-effect transistors.

10. A comparator arrangement comprising a comparator as claimed in claim 1 wherein the arrangement further comprises a second comparator of the same structure as the first comparator, in which second comparator the comparison stage constitutes an amplifier stage which serves to amplify the logic states of a digital signal and its complement received from the first comparator, the latching stage, which is coupled to the amplifier stage, stores the logic states determined by signals from the amplifier stage, and the control electrodes of the transistors of the third differential pair of the second comparator receive a complementary clock signal.

11. A comparator as claimed in claim 10, wherein the current-source transistor of the first differential pair of the second comparator is controlled by the complementary clock signal.

12. A comparator arrangement as claimed in claim 10, wherein the current-source transistor of the first differential pair of the second comparator is controlled by the potential of a third d.c. supply.

13. An analog-to-digital converter for obtaining an n-bit digital output signal, wherein the analog-to-digital converter comprises $2^n$ parallel-connected clocked comparators as claimed in claim 1 and in that the analog input signal to be converted is applied to one input of each comparator and a different reference voltage is applied to the other input of each comparator, the outputs of the comparators being connected to an encoding device whose output supplies the n-bit digital output signal.

* * * * *